United States Patent
Yamamoto

(10) Patent No.: US 7,388,622 B2
(45) Date of Patent: Jun. 17, 2008

(54) TELEVISION TUNER WHICH CAN OBTAIN SUFFICIENT RECEIVING SENSITIVITY EVEN WHEN RECEIVING FM BROADCASTING SIGNAL

(75) Inventor: Masaki Yamamoto, Tokyo (JP)

(73) Assignee: Alps Electric Co., Ltd, Tokyo (JP)

( * ) Notice: Subject to any disclaimer, the term of this patent is extended or adjusted under 35 U.S.C. 154(b) by 563 days.

(21) Appl. No.: 11/142,431

(22) Filed: Jun. 1, 2005

(65) Prior Publication Data
US 2005/0270429 A1 Dec. 8, 2005

(30) Foreign Application Priority Data
Jun. 4, 2004 (JP) ............... 2004-167319

(51) Int. Cl.
*H04N 5/44* (2006.01)
(52) U.S. Cl. .................................... 348/729
(58) Field of Classification Search ............... 348/729, 348/731, 735, 733, 732; 455/180.4, 195.1
See application file for complete search history.

(56) References Cited

U.S. PATENT DOCUMENTS

| 4,792,989 | A | * | 12/1988 | Cowley | 455/195.1 |
|---|---|---|---|---|---|
| 5,272,525 | A | * | 12/1993 | Borchardt et al. | 348/729 |
| 5,276,904 | A | * | 1/1994 | Mutzig et al. | 725/68 |
| 6,122,493 | A | * | 9/2000 | Kobayashi et al. | 455/193.1 |
| 6,683,656 | B1 | * | 1/2004 | Kikuchi | 348/729 |
| 6,721,017 | B2 | * | 4/2004 | Yamamoto | 348/729 |
| 6,731,348 | B2 | * | 5/2004 | Osada et al. | 348/729 |

FOREIGN PATENT DOCUMENTS

| JP | 07-283693 | 10/1995 |
|---|---|---|
| JP | 2001-238143 | 8/2001 |

\* cited by examiner

Primary Examiner—Paulos M. Natnael
(74) Attorney, Agent, or Firm—Brinks Hofer Gilson & Lione

(57) ABSTRACT

First varactor diodes for changing tuning frequency are provided at tuning circuits, a second varactor diode for changing an oscillating frequency is provided at an oscillator, tuning voltages between both ends of the first varactor diodes become equal to the tuning voltage between both ends of the second varactor diode when a television tuner receives a television signal, and the tuning voltages between both ends of the first varactor diodes become lower than the tuning voltage between both ends of the second varactor diode when the television tuner receives a FM broadcasting signal.

5 Claims, 3 Drawing Sheets

FIG. 1
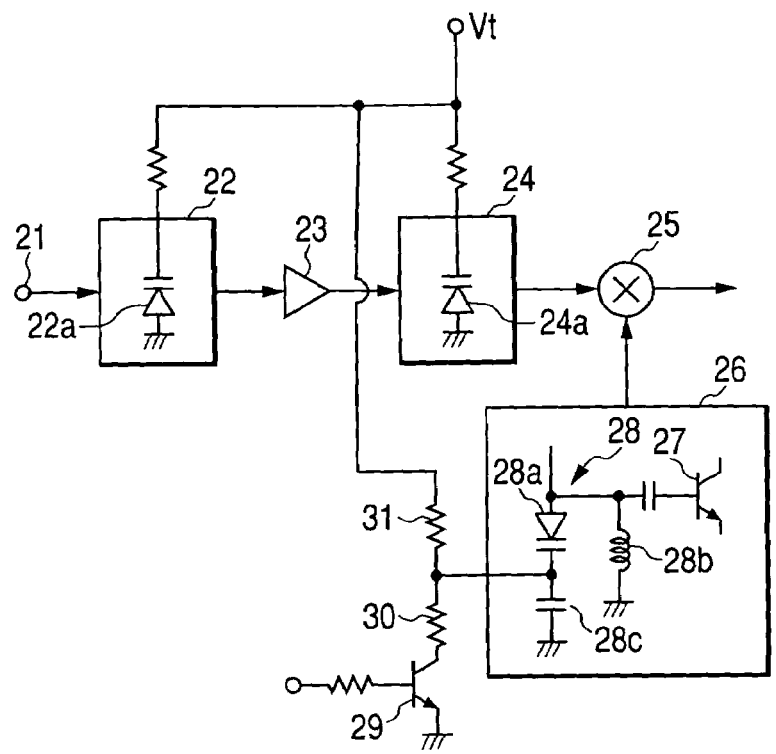
FIG. 2A
FIG. 2B
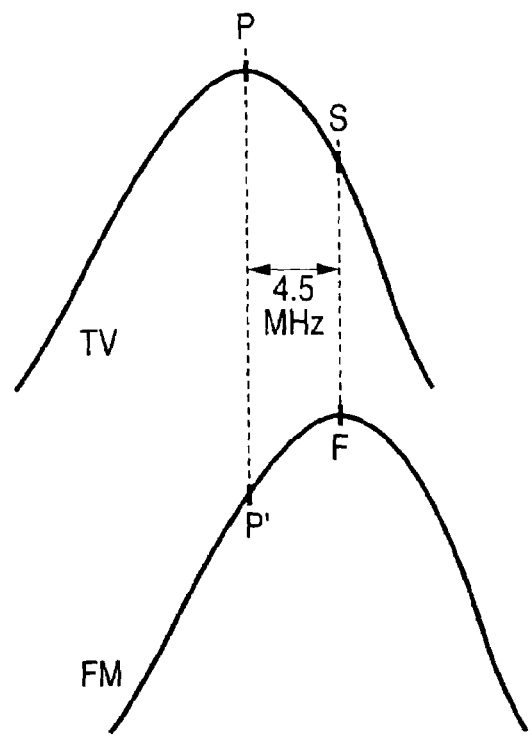

TELEVISION TUNER WHICH CAN OBTAIN SUFFICIENT RECEIVING SENSITIVITY EVEN WHEN RECEIVING FM BROADCASTING SIGNAL

This application claims the benefit of priority to Japanese Patent Application No. 2004-167319, filed on Jun. 4, 2004, herein incorporated by reference.

BACKGROUND OF THE INVENTION

1. Field of the Invention

The present invention relates to a television tuner.

2. Description of the Related Art

A conventional tuner used for a television receiver and the like will be described with reference to FIG. 4. A high frequency tuning circuit 11 is connected between an antenna 10 and a mixer 1 of a first frequency converting circuit 6, a first tuning voltage VT1 of a variable voltage source 9 is supplied as a tuning voltage of a variable capacity diode, which forms a first local oscillating circuit 2, and a second tuning voltage VT2, which is obtained by expanding the variable range of the first tuning voltage VT1, is supplied as the tuning voltage of the variable capacity diode, which forms the high frequency tuning circuit 11. The high frequency tuning circuit 11 and the first local oscillating circuit 2 include variable capacity diodes as a capacitive element respectively.

The second tuning voltage VT2 can be obtained by applying the first tuning voltage VT1 to an expander 12, and the second tuning voltage VT2 has a variable range, which is expanded 7 times larger than that of the first tuning voltage VT1. The second tuning voltage VT2 is made to have the 7 times larger variable range than that of the first tuning voltage VT1 on the assumption that it will satisfy the condition, on which tracking errors do not occur, if the variable ratio of the total capacitance of the high frequency tuning circuit 11 becomes 1.21 by making the variable range of the second tuning voltage VT2 7 times, which is close to 7.34, larger than that of the first tuning VT1, since the variable ratio of the total capacitance of the high frequency tuning circuit 11 is 7.34 times larger than that of the first local oscillating circuit 2.

Also, a received high frequency signal is mixed with the oscillating signal of the first local oscillating circuit 2, and then becomes a first intermediate frequency signal. The first intermediate frequency signal is amplified in a first intermediate frequency amplifying circuit 3, and then mixed with the oscillating signal of a second frequency converting circuit 5 so as to become a second intermediate frequency signal. The second intermediate frequency signal is applied to a detection circuit (not shown) through a terminal 8 (For example, see Japanese Unexamined Patent Application Publication No. 07-283693 (FIG. 1).

In the case of a variable capacity diode used for the high frequency tuning circuit 11 and the first local oscillating circuit 2, an anode is grounded, and a cathode is applied with the tuning voltage, but tracking error does not occur. Also, when the variable capacity diode having the above structure receives a television signal, the tuning characteristic of the high frequency tuning circuit 11 is set to have the video carrier frequency P at the peak and the voice carrier frequency S at a location several dB lower than that of the video carrier frequency P as shown in FIG. 5A, thereby the signal is frequency-converted to the intermediate frequency signal. It is because the frequency characteristic of the video signal after demodulation is required to be flat.

However, if the receiving band is widened to receive the FM broadcasting, and the FM broadcasting is frequency-converted into the television voice intermediate frequency signal at the above state, the tuning characteristic of the high frequency tuning circuit is changed to have a frequency P', which is 4.5 MHz lower than the frequency F of the FM broadcasting signal, which is to be received, at the peak as shown in FIG. 5B, and there is a problem in that the level of the FM broadcasting signal, which is to be received, is lowered, thereby the receiving sensitivity deteriorates.

SUMMARY OF THE INVENTION

An object of the present invention is to provide a television tuner, which can obtain sufficient receiving sensitivity even when receiving an FM broadcasting signal.

In order to solve the above-mentioned problem, in a television tuner according to the present invention including a tuning circuit, which is tuned to a television signal to be received; a mixer, which converts the television signal into an intermediate frequency signal; and an oscillator, which supplies a local oscillating signal, the frequency of which is changed, to the mixer in conjunction with a tuning frequency of the tuning circuit, a first varactor diode is further provided at the tuning circuit to change the tuning frequency, and a second varactor diode is further provided at the oscillator to change an oscillating frequency. In the television tuner, the tuning voltage between both ends of the first varactor diode is made equal to the tuning voltage between both ends of the second varactor diode when the television tuner receives the television signal, and the tuning voltage between both ends of the first varactor diode is made larger than the tuning voltage between both ends of the second varactor diode when the television tuner receives an FM broadcasting signal.

In addition, the anodes of the first and second varactor diodes are DC-grounded, the cathode of the first varactor diode is applied with the tuning voltage, and the cathode of the second varactor diode is applied with the tuning voltage when the television tuner receives the television signal, and with the divided tuning voltage when the television tuner receives the FM broadcasting signal.

Further, the oscillator has the second varactor diode and a tuning circuit including an inductance element, one end of which is connected to the anode of the second varactor diode, and the other end of which is grounded, and a switch transistor, an emitter of which is grounded, is further provided. A collector of the switch transistor is connected with the cathode of the second varactor diode with a first resistance, and the tuning voltage is applied to the cathode of the second varactor diode through a second resistance.

Furthermore, the anodes of the first and second varactor diodes are applied with the tuning voltage, and the anode of the first varactor diode is DC-grounded. The anode of the second varactor diode is DC-grounded when the television tuner receives the television signal, and the anode of the second varactor diode is applied with a voltage lower than the tuning voltage when the television tuner receives the FM broadcasting signal.

In addition, the oscillator has the second varactor diode and a tuning circuit including an inductance element, one end of which is connected to the anode of the second varactor diode, and the other end of which is grounded through a condenser, a switch transistor, the emitter of which is grounded, and a voltage dividing circuit connected between the collector of the switch transistor and the ground are further provided. The collector of the switch transistor is pulled-up to a power supply source, and the other end of the inductance element is connected with a dividing point of the voltage dividing circuit.

The first varactor diode is provided at the tuning circuit to change the tuning frequency, and the second varactor diode is provided at the oscillator to change an oscillating frequency. Also, the tuning voltage between both ends of the first varactor diode is made equal to the tuning voltage between both ends of the second varactor diode when the television tuner receives a television signal, and the tuning voltage between both ends of the first varactor diode is made lower than the tuning voltage between both ends of the second varactor diode when the television tuner receives a FM broadcasting signal. Therefore, the tuning circuit can be tuned to the FM broadcasting signal, which is to be received. Accordingly, the receiving sensitivity of the FM broadcasting signal can be improved.

In addition, the anodes of the first and second varactor diodes are DC-grounded, the cathode of the first varactor diode is applied with the tuning voltage, and the cathode of the second varactor diode is applied with the tuning voltage when the television tuner receives the television signal, and with the divided tuning voltage when the television tuner receives the FM broadcasting signal. Therefore, the tuning voltage between both ends of the second varactor diode can be lower than the tuning voltage between both ends of the first varactor diode when the television tuner receives the FM broadcasting signal.

Further, the oscillator has the second varactor diode and the tuning circuit including an inductance element, one end of which is connected with the anode of the second varactor diode, and the other end of which is grounded, a switch transistor, the emitter of which is grounded, is further provided, the collector of the switch transistor is connected with the cathode of the second varactor diode with a first resistance, and the cathode of the second varactor diode is applied with the tuning voltage through a second resistance, the switch transistor is turned on when the television tuner receives the FM broadcasting signal, and thus the tuning voltage between both ends of the second varactor diode can be lower than the tuning voltage between both ends of the first varactor diode.

Furthermore, the anodes of the first and second varactor diodes are applied with the tuning voltage, the anode of the first varactor diode is DC-grounded, the anode of the second varactor diode is DC-grounded when the television tuner receives the television signal, and the anode of the second varactor diode is applied with a voltage lower than the tuning voltage when the television tuner receives the FM broadcasting signal. Therefore, the tuning voltage between both ends of the second varactor diode can be lower than the tuning voltage between both ends of the first varactor diode when the television tuner receives the FM broadcasting signal.

In addition, the oscillator has the second varactor diode and the tuning circuit including an inductance element, one end of which is connected with the anode of the second varactor diode, and the other end of which is grounded through a condenser, a switch transistor, the emitter of which is grounded, and a voltage dividing circuit connected between the collector of the switch transistor and the ground are provided, the collector of the switch transistor is pulled-up to a power supply source, and the other end of the inductance element is connected with the dividing point of the voltage dividing circuit. Therefore, the switch transistor is turned off when the television tuner receives the FM broadcasting signal, and thus the tuning voltage between both ends of the second varactor diode can be lower than the tuning voltage between both ends of the first varactor diode.

BRIEF DESCRIPTION OF THE DRAWINGS

FIG. 1 is a circuit diagram of a television tuner according to a first embodiment of the present invention;

FIG. 2 is a diagram showing the tuning characteristic of the television tuner of the present invention;

DESCRIPTION OF THE PREFERRED EMBODIMENT

Figure 3:
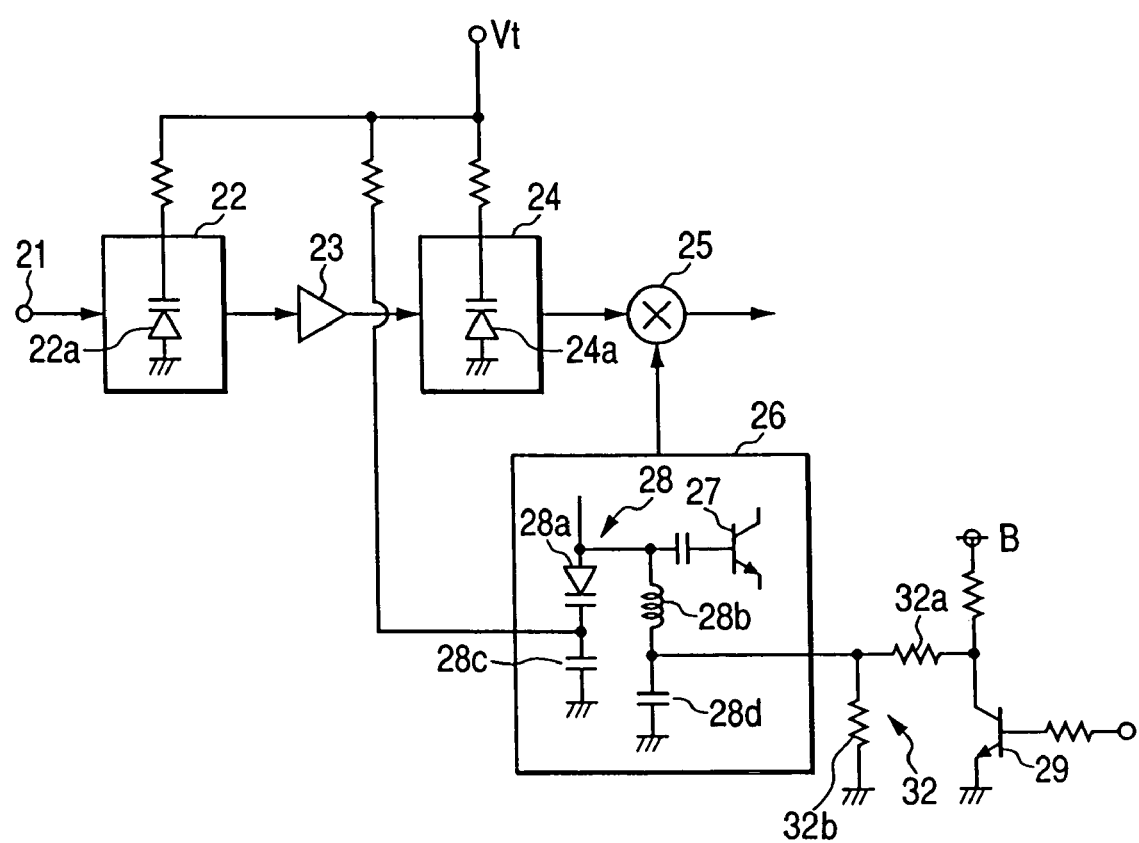
FIG. 3 is a circuit diagram of a television tuner according to a second embodiment of the present invention.
Figure 4:
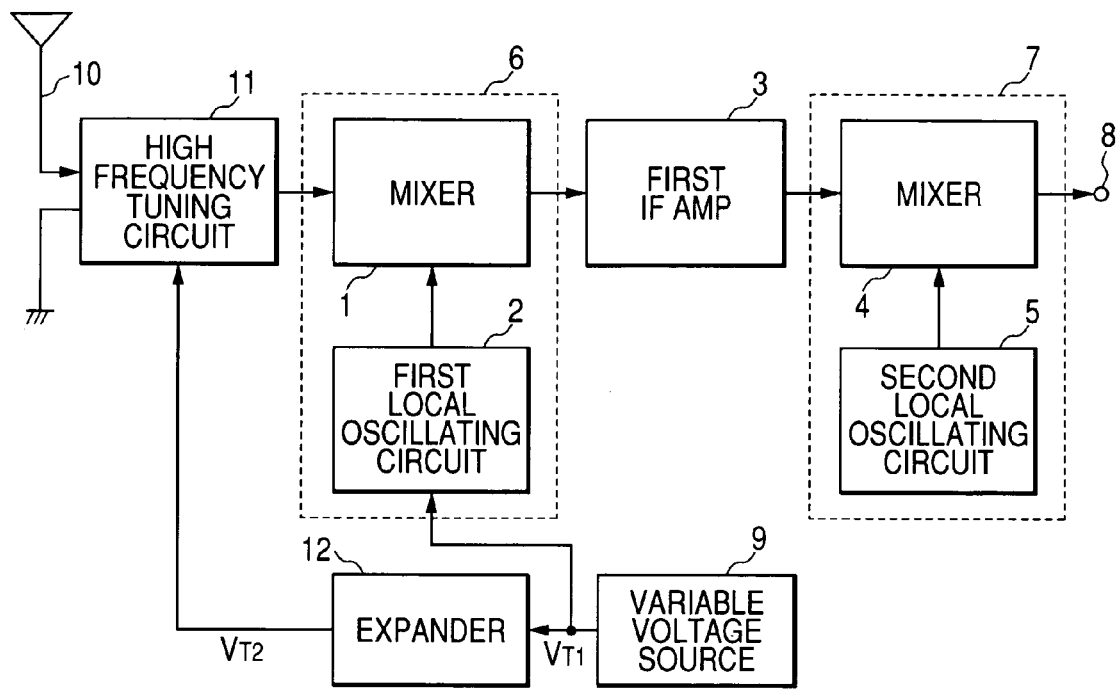
FIG. 4 is a circuit diagram of a conventional television tuner.

A television tuner of the present invention will be described with reference to FIGS. 1 to 3. FIG. 1 shows a first embodiment, FIG. 2 shows the tuning characteristic of a tuning circuit, and FIG. 3 shows a second embodiment.

First, in FIG. 1, a television signal and a FM broadcasting signal are input to an input port 21. An input tuning circuit 22 coupled with the input port 21 has a tuning varactor diode 22a. The input tuning circuit 22 is connected with a high frequency amplifier 23, which is connected with an interstage tuning circuit 24. The interstage tuning circuit 24 is provided with a tuning varactor diode 24a. Here, the varactor diode 22a of the input tuning circuit 22 and the varactor diode 24a of the interstage tuning circuit 24 are called as a first varactor diode. Anodes of the first varactor diodes 22a and 24a are DC-grounded, and cathodes thereof are applied with a tuning voltage Vt.

The interstage tuning circuit 24 is connected with a mixer 25. The mixer 25 is supplied with a local oscillating signal from an oscillator 26. The oscillator 26 has an oscillating transistor 27 and a tuning circuit 28 coupled with the oscillating transistor 27. The tuning circuit 28 has a second varactor diode 28a, an inductance element 28b, one end of which is connected to the anode of the second varactor diode 28a and the other end of which is grounded, and a condenser 28c connected between the cathode of the second varactor diode 28a and the ground.

In addition, a switch transistor 29, an emitter of which is grounded, is provided in addition to the oscillator 26. The collector of the switch transistor 29 is connected with the cathode of the second varactor diode 28a through a first resistance 30. The switch transistor 29 is turned on or off by a converting voltage applied to the base thereof.

Also, the cathode of the first varactor diode 28a is applied with the tuning voltage Vt through a second resistance 31. The cathodes of the first varactor diodes 22a and 24a are also applied with the tuning voltage Vt.

In the above-mentioned structure, the input television signal and FM broadcasting signal are input to the mixer through two tuning circuits 22 and 24, and are mixed with the local oscillating signal to be frequency-converted into the intermediate frequency signal. However, when the television tuner receives the television signal, the switch transistor is turned off.

As a result, the cathode of the second varactor diode 28a is applied with a voltage equal to the tuning voltages applied to the cathodes of the first varactor diodes 22a and 24a, and the television signal of each channel is converted into a predetermined intermediate frequency signal while the tracking error is not generated between the tuning frequencies of the tuning circuits 22 and 24 and the oscillating frequency of the oscillator 26. The total tuning characteristics of the tuning circuits 22 and 24 have the video carrier frequency P at the peak and the voice carrier frequency S at a location several dB lower than that of the video carrier frequency P, as shown in FIG. 2A. Also, the video carrier is converted into the video intermediate frequency, and the voice carrier is converted into the voice intermediate frequency.

Figure 5A:
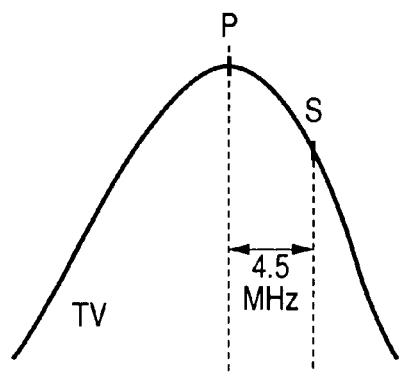
FIG. 5 is a diagram showing the tuning characteristic of the conventional television tuner.
Figure 5B:
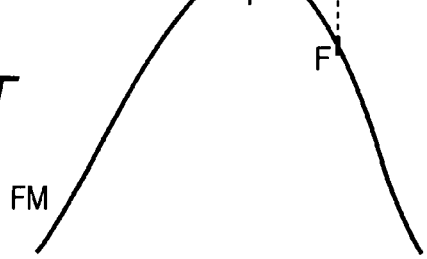

On the other hand, when the television tuner receives the FM broadcasting signal, the switch transistor 29 is turned on. As a result, the cathode of the second varactor diode 28a is applied with a tuning voltage divided by the first resistance 30 and the second resistance 31. That is, when the television tuner receives the FM broadcasting signal, the tuning voltage between the anode and cathode of the second varactor diode 28a becomes relatively lower than those of the first varactor diodes 22a and 24a. As a result, the oscillating frequency is deviated from the FM broadcasting signal, and is shifted to the lower side. FIG. 5B shows the total tuning characteristic of this case.

However, if the tuning voltage Vt is increased to match the oscillating frequency to an originally necessary frequency, the tuning frequencies of the tuning circuits 22 and 24 are shifted to the higher side, and thus can be tuned to the frequency F to be received, as shown in FIG. 2B.

FIG. 3 shows the second embodiment. FIG. 3 is different from FIG. 1 in the structure of the tuning circuit 28 in the oscillator 26 and in the structure of applying the tuning voltage to the second varactor diode 28a. Since the other structures of FIG. 3 are equal to those of FIG. 1, they will not be described.

The tuning circuit 28 has a second varactor diode 28a, an inductance element 28b, one end of which is connected to the anode of the second varactor diode 28a, and the other end of which is grounded through a condenser 28d, and a condenser 28c connected between the cathode of the second varactor diode and the ground. The switch transistor 27 has an emitter grounded and a collector pulled-up to a power supply source B. Also, a voltage dividing circuit 32 including resistances 32a and 32b is connected between the collector and the ground. Also, the other end of the inductance element 28b is connected to the dividing point (connection point between the resistances 32a and 32b). Further, the cathode of the second varactor diode 28a is applied with the tuning voltage.

In the structure shown in FIG. 3, the switch transistor 29 is turned on when the television tuner receives the television signal, and is turned off when the television tuner receives the FM broadcasting signal. Accordingly, when the television tuner receives the television signal, the anode of the second varactor diode 28a is DC-grounded, and then the television tuner has the same structure as that shown in FIG. 1. Also, when the television tuner receives the FM broadcasting signal, the voltage divided by the voltage dividing circuit 32 is applied to the anode of the second varactor diode 28. Therefore, like the operation of FIG. 1, the tuning voltage between both end of the second varactor diode 28a becomes lower than the voltages between both ends of the first varactor diodes 22a and 24a when the television tuner receives the FM broadcasting signal. Accordingly, by the same operation as that of FIG. 1, when the television tuner receives the FM broadcasting signal, the tuning circuits 22 and 24 can be tuned to the signal to be received.

The invention claimed is:

1. A television tuner comprising:

a tuning circuit, which is tuned to a television signal to be received;

a mixer for converting the television signal into an intermediate frequency signal; and an oscillator for supplying to the mixer a local oscillating signal, frequency of which is changed in accordance with tuning frequency of the tuning circuit, wherein a first varactor diode for changing the tuning frequency is provided at the tuning circuit, a second varactor diode for changing an oscillating frequency is provided at the oscillator, a tuning voltage between both ends of the first varactor diode becomes equal to the tuning voltage between both ends of the second varactor diode when the television tuner receives a television signal, and the tuning voltage between both ends of the first varactor diode becomes lower than the tuning voltage between both ends of the second varactor diode when the television tuner receives a FM broadcasting signal.

2. The television tuner according to claim 1, wherein anodes of the first and second varactor diodes are DC-grounded, a cathode of the first varactor diode is applied with the tuning voltage, and a cathode of the second varactor diode is applied with the tuning voltage when the television tuner receives the television signal, and is applied with the divided tuning voltage when the television tuner receives the FM broadcasting signal.

3. The television tuner according to claim 2, wherein the oscillator has the second varactor diode and the tuning circuit including an inductance element, one end of which is connected to the anode of the second varactor diode, and the other end of which is grounded, a switch transistor, an emitter of which is grounded, is provided, a first resistance is connected between a collector of the switch transistor and the cathode of the second varactor diode, and the cathode of the second varactor diode is applied with the tuning voltage through a second resistance.

4. The television tuner according to claim 1, wherein anodes of the first and second varactor diodes are applied with the tuning voltage, the anode of the first varactor diode is DC-grounded, the anode of the second varactor diode is DC-grounded when the television tuner receives the television signal, and the anode of the second varactor diode is applied with a voltage lower than the tuning voltage when the television tuner receives the FM broadcasting signal.

5. The television tuner according to claim 4, wherein the oscillator has the second varactor diode and the tuning circuit including an inductance element, one end of which is connected to the anode of the second varactor diode, and the other end of which is grounded through a condenser, a switch transistor, an emitter of which is grounded, and a voltage dividing circuit connected between a collector of the switch transistor and the ground are provided, the collector of the switch transistor is pulled-up to a power supply source, and the other end of the inductance element is connected to a dividing point of the voltage dividing circuit.

* * * * *